United States Patent [19]

Auman

[11] Patent Number: 5,324,810
[45] Date of Patent: Jun. 28, 1994

[54] POLYIMIDES BASED ON A 9-ARYL-9(PERFLUOROALKYL)-XANTHENE-2,3,6,7-DIANHYDRIDE OR 9,9'-BIS(PERFLUORO-ALKYL)XANTHENE-2,3,6,7-DIANHYDRIDE AND BENZIDINE DERIVATIVES

[75] Inventor: Brian Auman, Newark, Del.

[73] Assignee: E. I. Du Pont de Nemours and Company, Wilmington, Del.

[21] Appl. No.: 965,552

[22] Filed: Oct. 23, 1992

Related U.S. Application Data

[63] Continuation of Ser. No. 720,680, Jun. 25, 1991, abandoned.

[51] Int. Cl.$^5$ ............................................. C08G 73/10
[52] U.S. Cl. .................................. 528/208; 428/473.5; 528/176; 528/183; 528/185; 528/188; 528/190; 528/191
[58] Field of Search ............... 528/176, 183, 185, 188, 528/190, 191, 208; 428/473.5

[56] References Cited

U.S. PATENT DOCUMENTS

| | | | |
|---|---|---|---|
| 5,051,520 | 9/1991 | Trofimenko | 549/388 |
| 5,071,997 | 12/1991 | Harris | 528/353 |

FOREIGN PATENT DOCUMENTS

| | | |
|---|---|---|
| 260933 | 8/1988 | Japan . |
| 372528 | 8/1989 | Japan . |
| WO9101340 | 7/1991 | World Int. Prop. O. . |

OTHER PUBLICATIONS

JP-116085 Nov. 05, 1989 Nippon Teleg & Teleph Considered to the extent of English Abstract.

*Primary Examiner*—D. S. Nakarani

[57] ABSTRACT

Polyimide compositions, films, and electronic devices using polyimides, based on 9-aryl-9(perfluoroalkyl)xanthene-2,3,6,7-dianhydride or 9,9'-bis(perfluoroalkyl)xanthene-2,3,6,7-dianhydride and benzidine derivatives. These polyimides offer a combination of low linear coefficient of thermal expansion, low dielectric constant, and low water absorption.

10 Claims, No Drawings

POLYIMIDES BASED ON A 9-ARYL-9(PERFLUOROALKYL)-XANTHENE-2,3,6,7-DIANHYDRIDE OR 9,9'-BIS(PERFLUORO-ALKYL)XANTHENE-2,3,6,7-DIANHYDRIDE AND BENZIDINE DERIVATIVES

This is a continuation of application Ser. No. 07/720,680 filed Jun. 25, 1991, now abandoned.

FIELD OF THE INVENTION

This invention relates to polyimide compositions, films, and electronic devices using polyimides, based on 9-aryl-9(perfluoroalkyl)xanthene-2,3,6,7-dianhydride or 9,9'-bis(perfluoroalkyl)xanthene-2,3,6,7-dianhydride and benzidine derivatives.

BACKGROUND OF THE INVENTION

Polyimides constitute a class of valuable polymers being characterized by thermal stability, inert character, usual insolubility in even strong solvents, and high $T_g$, among others. Their precursors are usually polyamic acids, which may take the final imidized form either by thermal or by chemical treatment.

Polyimides have always found a large number of applications requiring the aforementioned characteristics in numerous industries, and recently their applications have started increasing dramatically in electronic devices, especially as dielectrics. With continuously escalating sophistication in such devices, the demands on the properties and the property control are becoming rather vexatious.

Especially for the electronics industry, improvements of polyimides are needed in forming tough, pin-hole free coatings, having lower dielectric constant, lower linear coefficient of thermal expansion, and lower moisture absorption, among others. It is not usually possible to maximize all properties, since many of them are antagonistic. Thus, only a compromised solution has so far been achieved by at least partially sacrificing one or more of these properties in order to maximize a desired one.

It has now been found that polyimides based on 9-aryl-9(perfluoroalkyl)xanthene-2,3,6,7-dianhydride or 9,9'-bis(perfluoroalkyl)xanthene-2,3,6,7-dianhydride and a class of benzidine derivatives provide compositions which may be used to form dielectric films for electronic circuits characterized by high thermal stability, low linear coefficient of thermal expansion, low dielectric constant, and low water absorption.

Japanese Patent Application Publication Kokai Hei 2-60933 (Masaki Ishisawa et al., Pub. Date: Mar. 1, 1990) discloses certain compositions of polyimides containing a benzidine derivative and derivatives containing fluorochains. However, one of the disadvantages of these compositions is the fact that the fluorochains contain adjacent carbon atoms having hydrogen and fluorine atoms, and are subject to premature thermal decomposition, due to dehydrofluorination. This publication does not recognize the importance of low water absorption, as this property is not even mentioned. Furthermore, this publication does not mention, suggest, or imply the combination of 9-aryl-9-(perfluoroalkyl)xanthene-2,3,6,7-dianhydride or 9,9'-bis(perfluoroalkyl)xanthene-2,3,6,7-dianhydride and benzidine derivatives for achieving the advantages of the present invention.

SUMMARY OF THE INVENTION

The instant invention is directed to polyimide compositions, films, and electronic devices using polyimides, based on 9-aryl-9(perfluoroalkyl)xanthene-2,3,6,7-dianhydride or 9,9'-bis(perfluoroalkyl xanthene-2,3,6,7-dianhydride and benzidine derivatives. More particularly, it pertains to a polyimide having the structure:

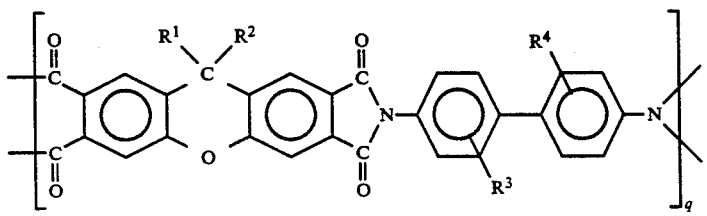

wherein $R^1$ is aryl Or $R^2$, $R^2$ is —$CF_3$, $R^3$ and $R^4$ are selected from the group consisting of —$C_mF_{2m+1}$, —$C_pH_{2p+1}$, and —$OC_pH_{2p+1}$ m is an integer 0–4, p is an integer 0–2, and q is an integer greater than 10.

Preferably, in the above polyimide $R^3$ and $R^4$ are in 2,2'-positions, respectively, in the benzidine ring, and are selected from the group consisting of —$C_mF_{2m+1}$ and —$C_pH_{2p+1}$, m is an integer 1–4, and p is an integer 1–2.

The 2,2'- positions on the benzidine ring are preferred, because electron withdrawing groups, such as for example perfluorinated chains, reduce the reactivity of the amine groups (being in positions 4,4') of the benzidine derivative if they are in the 3,3' positions. They may also reduce the reactivity of the benzidine amino groups, due to steric effects in a similar manner as non-electron-withdrawing groups, such as for example hydrocarbon chains, may do.

$R^3$ and $R^4$ may each take the form of a single chlorine atom in the benzidine ring, which however, is in most cases undesirable for electronic applications, due to potential for corrosion.

Also, preferably, preferably both $R^1$ and $R^2$ are —$CF_3$.

Also it is preferable that $R^3$ and $R^4$ are —$CF_3$, and even more preferable that all $R^1$, $R^2$, $R^3$, and $R^4$ are —$CF_3$.

The instant invention also pertains to films comprising polyimides as defined above.

In addition, this invention is also directed to electronic devices containing a conductor or semiconductor comprising:

(a) a substrate which comprises a conductor, semiconductor, or insulator; and (b) a dielectric film in contact with the substrate, the dielectric film comprising a polyimide derived from a fluoroxanthene derivative and a benzidine ring derivative, as defined above.

By the expression "in contact with the substrate" it is meant that the film is required to be in contact with the conductor, or the semiconductor, or the insulator, or any combination thereof.

DETAILED DESCRIPTION OF THE INVENTION

The instant invention is directed to polyimide compositions, films, and electronic devices using polyimides, based on 9-aryl-9(perfluoroalkyl)xanthene-2,3,6,7-dianhydride or 9,9'-bis(perfluoroalkyl)xanthene-2,3,6,7-dianhydride and benzidine derivatives.

As aforementioned, improvements of polyimides are needed in forming tough, pin-hole free coatings, having lower dielectric constant, lower linear coefficient of thermal expansion, lower moisture absorption, and high thermal stability, among others. It is not usually possible to maximize all properties, since many of them are antagonistic. Thus, only a compromised solution has been achieved so far, by at least partially sacrificing one or more of these properties in order to maximize a desired one. In order to reach such a compromised solution, fluorinated dianhydrides and/or diamines have been broadly utilized in the past. However, while fluorinated polyimides typically give lower moisture and dielectric constant, they exhibit high CTE. For example, commercial Pyralin® PI-2566, based on 2,2'-bis(3,4-dicarboxyphenyl) hexafluoropropane (6FDA) and 4,4'-diaminodiphenyl ether (4,4'-ODA) from Du Pont, Wilmington, Del., exhibits a linear coefficient of thermal expansion (CTE) of about 50 ppm between 0° and 200° C. It is understood that this linear coefficient of thermal expansion for such commercial Pyralin® PI-2566 is expressed in a conventional manner as ppm per °C. i.e., this material has a linear coefficient of therml expansion of 50 ppm/°C. between 0° and 200°. On the other hand, even highly optimized nonfluorinated polyimides, such as for example commercial Pyralin® PI-2611 (based on 3,3',4,4'-biphenyltetracarboxylic dianhydride and paraphenylene diamine, from Du Pont, Wilmington, Del.), may have low moisture absorption and low linear coefficient of thermal expansion, but rather high dielectric constant, as shown in Example 6.

The linear coefficient of thermal expansion is considered to be low if it has a value of 20 ppm, or lower. This is because the components involved, such as for example conductors, semiconductors, and inorganic dielectrics or insulators have linear coefficients of thermal expansion (CTE) in the range of 0-20 ppm. For example, the CTE of silicon dioxide is 0.4 ppm, the CTE of silicon is 3-4 ppm, the CTE of aluminum oxide is 6 ppm, and the CTE of copper is 17 ppm. Although it is preferable to have a perfect match of the CTE's of the substrate and the polyimide coating, this is impractical in most cases, since a variety of materials are involved within the same electronic device, such as for example circuitry on even a single silicon wafer. Depending on the particular case, CTE's closer to a narrower subrange within the broader 0-20 ppm range may be desired. It is understood that this linear coefficient of thermal expansion including silicon dioxide, silicon, aluminum oxide and copper is expressed in a conventional manner as ppm per °C., i.e., the values given in this paragraph are based on a linear coefficient of thermal expansion of ppm per °C.

The water absorption in the case of polyimides at 85% R.H. is considered to be low, when it is less than 2.5%, preferably less than 2.0%, and even more preferably less than 1.5%. As a matter of fact, the lower the water absorption is the more preferred the polyimide is, provided there is no degradation of the rest of the important properties.

The dielectric constant is considered to be low if it is lower than 2.8 under dry conditions, and preferably lower than 2.5. A dielectric constant of 3.0 or over is less desirable, or it may even become unacceptable for a number of applications, especially as electronic circuitry becomes smaller and circuit patterns become finer.

As illustrated in Examples 2 and 4, electronic devices, such as for example silicon wafers which may contain electronic components, such as conductors, semiconductors, insulators, and combinations thereof, may be coated with the compositions of the present invention. Other examples include printed circuits, hybrid circuits, and the like. The compositions of the present invention in the form of dielectric films are characterized by low linear coefficient of thermal expansion, low dielectric constant, low water absorption, and high thermal stability, as illustrated in Examples 3 and 4.

Thus, a dielectric film made from an exemplary composition of the present invention, based on 9,9'-bis(trifluoromethyl)xanthene-2,3,6,7-dianhydride (BXDA) and 2,2'-bis(trifluoromethyl)benzidine (TFMB), was found to have a linear coefficient of thermal expansion (CTE) of 5-7 ppm, i.e., per °C., water absorption 1.2% at 85% R.H., a dry dielectric constant of 2.4, and a decomposition temperature of 415° C., in air.

Another dielectric film made from a different exemplary composition of the present invention, based on 9-phenyl-9(trifluoromethyl)xanthene-2,3,6,7-dianhydride (PXDA) and 2,2'-bis(trifluoromethyl)benzidine (TFMB), was found to have a linear coefficient of thermal expansion (CTE) of 6-20 ppm, i.e., per °C., water absorption 1.55% at 85% R.H., a dry dielectric constant of 2.7, and a decomposition temperature of 419° C., in air.

The variability in the linear coefficient of thermal expansion is due to the fact that the type of application (such as for example the angular speed of the spincoater) of the film influences the molecular orientation, and consequently the linear coefficient of thermal expansion within certain limits.

Examples of preferred solvents, which may be used in the practice of the present invention are polar organic solvents, such as sulfoxide type solvents including dimethylsulfoxide, diethylsulfoxide, and the like, formamide type solvents including N,N-dimethylformamide, N,N-diethylformamide, and the like, acetamide type solvents including N,N-dimethylacetamide, N,N-diethylacetamide, and the like, pyrrolidone type solvents including N-methyl-2-pyrrolidone, N-cyclohexyl, 2-pyrrolidone, 1,3-dimethyl-2-imidozolidione, N-vinyl-2-pyrrolidone, and the like, phenolic solvents including phenol, o-, m-, p-cresol, xylenol, halogenated phenol, catechol, and the like, hexamethylphosphoramide, and a number of lactones including γ-butyrolactones. These solvents may be used alone or as a mixture. Partial use of aromatic hydrocarbons such as xylene, toluene, and the like, is also possible, and sometimes desirable, when for example removal of water as an azeotrope is needed.

BPDA: 3,3',4,4'-biphenyltetracarboxylic dianhydride
BXDA: 9,9'-bis(trifluoromethyl)xanthene-2,3,6,7-dianhydride
CHP: N-cyclohexyl-2-pyrrolidone
CTE: Linear Coefficient of Thermal Expansion
DMAC: Dimethylacetamide
DMB: 2,2'-dimethylbenzidine
DMSO: Dimethylsulfoxide
DSC: Differential Scanning Calorimetry
6FDA: 2,2'-bis(3,4-dicarboxyphenyl)hexafluoropropane
GPa: Gigapascal
GPC: Gel Permeation Chromatography
mmole: Millimole
MPa: Megapascal
NMP: N-methyl-2-pyrrolidone
ODA: 4,4'-Diaminodiphenyl ether
PPD: Paraphenylenediamine
ppm: Parts per million
PXDA: 9-phenyl-9'-trifluoromethylxanthene-2,3,6,7-dianhydride
R.H.: Relative Humidity
Tg: Glass transition temperature
TMA: Thermomechanical analysis All parts and percentages are given by weight unless otherwise stated.

EXAMPLE 1

Synthesis of Polyimide based on BXDA and TFMB

Into a 100 ml reaction kettle fitted with a nitrogen inlet and outlet, and a mechanical stirrer were charged 4.7090 g (10.2766 mmol) of 9,9'-bis(trifluoromethyl)xanthene-2,3,6,7-dianhydride (BXDA) and 3.2910 g (10.2766 mmol) of 2,2'-bis(trifluoromethyl)benzidine (TFMB). Shortly thereafter, 42 ml of NMP were added and stirring was begun. BXDA dissolved slowly into the reaction mixture and the temperature was maintained at room temperature overnight (ca. 20 hrs). Afterwards, the polymer solution was slowly pressure filtered through a 1 micron filter to yield a clear yellow solution.

EXAMPLE 2

Coating of silicon wafer with polyimide based on BXDA and TFMB

Part of the clear solution of Example 1 was spin coated onto a 5" silicon wafer. After spin coating, the wafer was immediately placed in an air oven at 135° C. for 30 min., then placed into a nitrogen oven and heated to 200° C. for 30 min and 350° C. for 1 hr. The resulting polyimide dielectric film was coherent and adhered well to the wafer.

EXAMPLE 3

Evaluation of the dielectric film of Example 2

In order to determine the properties of the dielectric film, the oxide layer of the silicon wafer was etched in aqueous HF. It yielded a free standing polyimide film which was pale yellow in color and creasable. The thickness of the film was 10.3 micrometers, and it gave the following mechanical properties when tested on an Instron Model 4501 per ASTM D 882 -83 (Method A): Tensile Strength=200 MPa, Tensile Elongation at Break=6%, and Young'ss Modulus=6.1 GPa. The linear coefficient of thermal expansion (CTE) of the film measured by TMA (10° C./min, 0°-200° C.) was found to be 5 ppm i.e., per °C., and 7 ppm i.e., per °C., by two separate measurements indicating the low CTE capability of this structure.

Thermal stability was evaluated by TGA (Thermo Gravimetric Analysis) in air at a temperature increase rate of 15° C./min. Initial weight loss was observed at 415° C.

The dielectric constant on the dried film was 2.4 at 1 MHz.

The clear solution of Example 1 was also used to spin coat a layer onto a quartz crystal. After treating the coated quartz crystal as described in Example 2, a dielectric film having a thickness of approximately 3 micrometers resulted. The moisture absorption of this film was measured on a quartz crystal microbalance and found to be 1.2% at 85% R.H.

EXAMPLE 4

Synthesis, use, and evaluation of Polyimide based on PXDA and TFMB

Similar to the procedure given in Example 1, a polymer was prepared from 4.7429 g (10.1709 mmol) 9-phenyl-9'-trifluoromethylxanthene-2,3,6,7-dianhydride (PXDA) and 3.2571 g (10.1709 mmol) 2,2'-bis(trifluoromethyl) benzidine (TFMB) in 32 ml NMP (20% solids). After dissolution, the reaction was allowed to proceed overnight at room temperature (ca. 16 hrs). An extremely thick poly(amic acid) solution resulted which was stepwise diluted with 10 ml NMP (16% solids), then 10 ml NMP (13% solids), then 7 ml NMP (~12% solids), then 6 ml NMP (11% solids), and finally 7 ml NMP (10% solids). Ample stirring time was given between dilutions to allow for homogenization. The dilution procedure was performed over a two day period. Afterwards, the solution was slowly pressure filtered through a 5 micron filter (1 micron filtration was found to be laboriously slow for this sample) and then spin coated onto silicon wafers and cured as given in Example 2. The resulting 8.1 micron pale yellow film had the following tensile properties: Tensile Strength=197 MPa, Tensile Elongation at Break=8%, and Young's Modulus=5.0 GPa. The linear coefficient of thermal expansion of the film was found to be 6 ppm and 20 ppm by two separate measurements indicating the low CTE potential for this structure. Likewise, dielectric constant and moisture absorption (measured as in Example 3) were found to be 2.7 and 1.55%, respectively.

Thermal stability was evaluated by TGA (Thermo Gravimetric Analysis) in air at a temperature increase rate of 15° C./min. Initial weight loss was observed at 419° C.

EXAMPLE 5

Synthesis, use, and evaluation of Polyimide based on BXDA and DMB

Into a 100 ml reaction kettle fitted with a nitrogen inlet and outlet, and a mechanical stirrer were charged 2.5329 g (11.9309 mmol) of 2,2'-dimethylbenzidine (DMB). The DMB was allowed to dissolve and then 5.4671 g (11.9309 mmol) of BXDA were added as a slurry in 25 ml NMP. Residual BXDA was carefully washed into the reactor with 11 ml NMP. The BXDA gradually dissolved into the reaction mixture and the temperature was maintained at room temperature overnight (ca. 17 hrs). Afterwards, the polymer solution was slowly pressure filtered through a 1 micron filter and then spin coated onto 5" silicon wafers according to the procedure in Example 1. The resulting 9.4 micron polyimide film was light in color and gave the following mechanical properties when tested as in Example 3. Tensile Strength=340 MPa, Tensile Elongation at Break =14%, and Young's Modulus=7.5 GPa. The linear coefficient of thermal expansion (CTE) of the film measured by TMA (10° C./min, 0°-200° C.) was found to be −3 ppm i.e., °C., indicating the low CTE capability of this structure. The dielectric constant on the dried film at 1 MHz was 2.6. The moisture absorption of a 3 micron film spin coated onto a quartz crystal and measured on a quartz crystal microbalance at room temperature was 2.3% at 85% relative humidity.

EXAMPLE 6

Comparative Example

Similar methods were used to prepare and analyze films based on commercial DuPont Pyralin® PI-2611 (based on 3,3′,4,4′-biphenyltetracarboxylic dianhydride (BPDA) and paraphenylenediamine (PPD). The CTE of this sample was found to be 4 ppm i.e., per °C., moisture absorption 1.4% but the dielectric constant was 3.1.

I claim:

1. A polyimide having the structure:

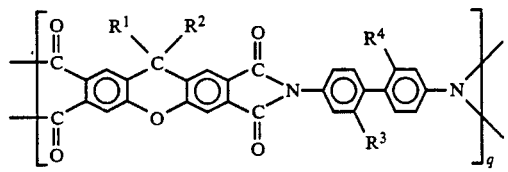

wherein
$R^1$ is aryl or $R^2$,
$R^2$ is $CF_3$,
$R^3$ and $R^4$ are $-C_mF_{2m+1}$,
m is an integer 1 to 4, and
q is an integer greater than 10.

2. A polyimide as defined in claim 1, wherein $R^1$ is phenyl.

3. A polyimide as defined in claim 1, wherein $R^1$ and $R^2$ are $-CF_3$.

4. A polyimide as defined in claim 1, wherein $R^3$ and $R^4$ are $-CF_3$.

5. A polyimide as defined in claim 1, wherein $R^1$, $R^2$, $R^3$, and $R^4$ are $-CH_3$.

6. A film comprising a polyimide having the structure:

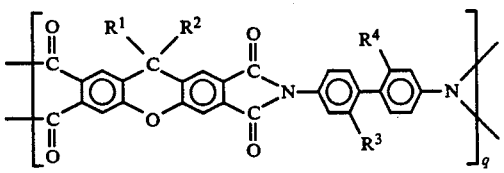

wherein
$R^1$ is aryl or $R^2$,
$R^2$ is $CF_3$,
$R^3$ and $R^4$ are $-C_mF_{2m+1}$,
m is an integer 1 to 4, and
q is an integer greater than 10.

7. A film as defined in claim 6, wherein $R^1$ is phenyl.

8. A film as defined in claim 6, wherein $R^1$ and $R^2$ are $-CF_3$.

9. A film as defined in claim 6, wherein $R^3$ and $R^4$ are $-CF_3$.

10. A film as defined in claim 6, wherein $R^1$, $R^2$, $R^3$, and $R^4$ are $-CF_3$.

* * * * *